(12) United States Patent
Kim et al.

(10) Patent No.: US 11,393,996 B2
(45) Date of Patent: Jul. 19, 2022

(54) ORGANIC ELECTRONIC DEVICE AND MANUFACTURING METHOD THEREOF

(71) Applicant: LG CHEM, LTD., Seoul (KR)

(72) Inventors: Younshin Kim, Daejeon (KR); Songrim Jang, Daejeon (KR); Doowhan Choi, Daejeon (KR); Jung Ha Park, Daejeon (KR); Seung Jun Yoo, Daejeon (KR)

(73) Assignee: LG CHEM, LTD., Seoul (KR)

(*) Notice: Subject to any disclaimer, the term of this patent is extended or adjusted under 35 U.S.C. 154(b) by 0 days.

(21) Appl. No.: 16/608,878

(22) PCT Filed: Aug. 24, 2018

(86) PCT No.: PCT/KR2018/009798
§ 371 (c)(1),
(2) Date: Oct. 28, 2019

(87) PCT Pub. No.: WO2019/039907
PCT Pub. Date: Feb. 28, 2019

(65) Prior Publication Data
US 2020/0091450 A1  Mar. 19, 2020

(30) Foreign Application Priority Data

Aug. 24, 2017  (KR) .................. 10-2017-0107435

(51) Int. Cl.
*H01L 31/00* (2006.01)
*H01L 51/42* (2006.01)
*H01L 51/00* (2006.01)

(52) U.S. Cl.
CPC .......... *H01L 51/426* (2013.01); *H01L 51/005* (2013.01)

(58) Field of Classification Search
CPC .. H01L 51/426; H01L 51/4233; H01L 51/005
See application file for complete search history.

(56) References Cited

U.S. PATENT DOCUMENTS

2011/0002970 A1   1/2011  Parashar
2011/0030789 A1*  2/2011  Krebs ................. H01L 51/4233
                                              136/258

(Continued)

FOREIGN PATENT DOCUMENTS

JP    2012191194 A    10/2012
JP    2013033906      2/2013

(Continued)

OTHER PUBLICATIONS

Alvarado et al., "Synthesis of Colloidal ZnO Nanoparticles and Deposit of Thin Films by Spin Coating Technique", Journal of Nanomaterials vol. 2013, Article ID 903191, 9 pages http://dx.doi.org/10.1155/2013/903191 (Year: 2013).*

(Continued)

*Primary Examiner* — Angelo Trivisonno
(74) *Attorney, Agent, or Firm* — Myers Bigel, P.A.

(57) ABSTRACT

The present application relates to an organic electronic device comprising a first electrode; a second electrode provided opposite to the first electrode; a photoactive layer provided between the first electrode and the second electrode; and an electron transfer layer provided between the photoactive layer and the first electrode, wherein the electron transfer layer comprises a zinc oxide (ZnO) nanoparticle having one or more amine groups bonding to a surface thereof, and a method for manufacturing the same.

16 Claims, 3 Drawing Sheets

(56) References Cited

U.S. PATENT DOCUMENTS

| | | | |
|---|---|---|---|
| 2013/0092229 A1* | 4/2013 | Xue | H01L 51/447 136/256 |
| 2014/0008747 A1 | 1/2014 | Uetani | |
| 2014/0053897 A1 | 2/2014 | Balasubramanian et al. | |
| 2014/0124757 A1 | 5/2014 | Sekiguchi et al. | |
| 2015/0107674 A1 | 4/2015 | Lee et al. | |
| 2016/0163988 A1* | 6/2016 | Carroll | H01L 51/0047 136/263 |

FOREIGN PATENT DOCUMENTS

| | | |
|---|---|---|
| KR | 1020110095470 | 8/2011 |
| KR | 101216610 | 12/2012 |
| KR | 1020130044462 | 5/2013 |
| KR | 1020130133571 | 12/2013 |
| KR | 1020150143010 | 12/2015 |
| KR | 101607478 | 3/2016 |
| KR | 1020160052871 | 5/2016 |
| KR | 1020160067340 | 6/2016 |
| KR | 1020160110863 | 9/2016 |
| WO | 2012/154557 | 11/2012 |
| WO | 2013099614 A1 | 7/2013 |

OTHER PUBLICATIONS

Rhodes ("Aggregation of zinc oxide nanoparticles: From non-aqueous dispersions to composites used as photoactive layers in hybrid solar cells"), Journal of Colloid and Interface Science 344 (2010) 261-271 (Year: 2010).*

Xu ("Highly efficient planar perovskite solar cells with a TiO2/ZnO electron transport bilayer"), J. Mater. Chem. A, 2015, 3, 19288 (Year: 2015).*

International Search Report corresponding to PCT/KR2018/009798; dated Mar. 7, 2019 (5 pages included English translation).

Lee et al. "Air-Stable Polymer Electronic Devices" Advanced Materials, 19(18):2445-2449 (2007).

* cited by examiner

ORGANIC ELECTRONIC DEVICE AND MANUFACTURING METHOD THEREOF

CROSS REFERENCE TO RELATED APPLICATIONS

This application is a 35 U.S.C. § 371 national stage application of PCT International Application No. PCT/KR2018/009798, filed Aug. 24, 2018, which claims priority from Korean Patent Application No. 10-2017-0107435, filed Aug. 24, 2017, the contents of which are incorporated herein in their entireties by reference. The above-referenced PCT International Application was published in the Korean language as International Publication No. WO 2019/039907 on Feb. 28, 2019.

TECHNICAL FIELD

The present specification relates to an organic electronic device and a method for manufacturing the same.

BACKGROUND ART

An organic solar cell, one of an organic electronic device, is a device capable of directly converting solar energy to electric energy by applying a photovoltaic effect. Solar cells are divided into inorganic solar cells and organic solar cells depending on the materials forming a thin film. Typical solar cells are fabricated using a p-n junction by doping crystalline silicon (Si), an inorganic semiconductor.

Electrons and holes generated by light absorption spread to p-n junction points, are accelerated by the electric field, and migrate to an electrode. However, existing inorganic solar cells already have limits in economic feasibility and material supplies, and therefore, organic solar cells that are readily processed, inexpensive, and easy to carry due to an ability to be bent or folded in various shapes such as a curved surface or a spherical surface regardless of a substrate shape have been highly favored as a long-term alternative energy source.

Such an organic solar cell may have different properties depending on an electron transfer layer material, a synthesis method or a coating method. Accordingly, studies on an electron transfer layer have been required for a high performance organic solar cell.

DISCLOSURE

Technical Problem

The present application is directed to providing an organic electronic device and a method for manufacturing the same.

Technical Solution

One embodiment of the present application provides an organic electronic device comprising a first electrode; a second electrode provided opposite to the first electrode; a photoactive layer provided between the first electrode and the second electrode; and an electron transfer layer provided between the photoactive layer and the first electrode, wherein the electron transfer layer comprises a zinc oxide (ZnO) nanoparticle having one or more amine groups bonding to a surface thereof.

Another embodiment of the present application provides a method for manufacturing an organic electronic device comprising preparing a substrate; forming a first electrode on the substrate; forming an electron transfer layer on the first electrode; forming a photoactive layer on the electron transfer layer; and forming a second electrode on the photoactive layer, wherein the electron transfer layer comprises a zinc oxide (ZnO) nanoparticle having one or more amine groups bonding to a surface thereof.

Still another embodiment of the present application provides a method for manufacturing an organic electronic device comprising preparing a substrate; forming a second electrode on the substrate; forming a photoactive layer on the second electrode; forming an electron transfer layer on the photoactive layer; and forming a first electrode on the electron transfer layer, wherein the electron transfer layer comprises a zinc oxide (ZnO) nanoparticle having one or more amine groups bonding to a surface thereof.

Advantageous Effects

An organic electronic device according to one embodiment of the present application uses an electron transfer layer comprising a zinc oxide (ZnO) nanoparticle having one or more amine groups bonding to a surface thereof and thereby has few trap sites caused by surface defects present on the zinc oxide (ZnO) nanoparticle surface, and as a result, is capable of increasing an open-circuit voltage (Voc) and increasing efficiency in the organic electronic device.

In addition, an organic electronic device according to one embodiment of the present application is capable of obtaining high efficiency by enhancing a fill factor (FF).

In addition, an organic electronic device according to one embodiment of the present application is effective in enhancing process efficiency, lowering costs and enhancing a production rate due to a simple manufacturing process.

In addition, an organic electronic device according to one embodiment of the present application is effective in enhancing energy conversion efficiency.

In addition, an organic electronic device according to one embodiment of the present application is effective in enhancing a lifetime due to few trap sites caused by electron transfer layer surface defects.

MODE FOR DISCLOSURE

Figure 1:
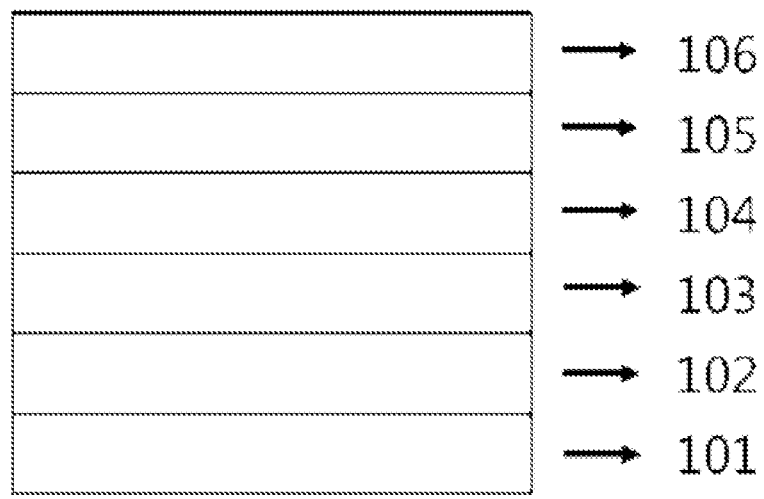
FIGS. 1 and 2 are structural sectional views of organic electronic devices according to embodiments of the present application.

Hereinafter, the present specification will be described in more detail.

Embodiments of the present disclosure will be described in detail with reference to accompanying drawings so that those skilled in the art may readily implement the present disclosure. However, the present disclosure may be embodied in various different forms, and is not limited to the embodiments described herein.

In the present application, a description of a certain part "including" certain constituents means capable of further including other constituents, and does not exclude other constituents unless particularly stated on the contrary.

In the present application, a description of a certain member being placed "on" another member comprises not only a case of the one member adjoining the another member but a case of still another member being present between the two members.

One embodiment of the present application provides an organic electronic device comprising a first electrode; a second electrode provided opposite to the first electrode; a photoactive layer provided between the first electrode and the second electrode; and an electron transfer layer provided between the photoactive layer and the first electrode, wherein the electron transfer layer comprises a zinc oxide (ZnO) nanoparticle having one or more amine groups bonding to a surface thereof.

In addition, a hole transfer layer may be further included between the photoactive layer and the second electrode.

In one embodiment of the present application, types of bonding between the one or more amine groups and the zinc oxide (ZnO) nanoparticle may comprise covalent bonding, chemisorption or physisorption.

The organic electronic device may be selected from the group consisting of an organic light emitting device, an organic solar cell, an organic photodiode and an organic transistor.

Existing zinc oxide (ZnO) nanoparticles used as an electron transfer layer of an organic electronic device decrease efficiency and long-term stability of an organic solar cell by a defect site present on the surface functioning as a trap site, and the organic electronic device according to one embodiment of the present application is effective in enhancing performance of the organic electronic device by bonding an amine group to a zinc oxide (ZnO) nanoparticle surface and thereby reducing such a trap site.

Unlike bulk zinc oxide (ZnO), a Zn or O position may be empty or other rearrangements may occur on a zinc oxide (ZnO) nanoparticle surface, and accordingly, the trap site may be produced.

The trap site having high energy and unstable may decompose organic materials by causing an oxidation reaction, and may perform a role of storing electrons by forming another energy level.

By bonding an amine group to a zinc oxide (ZnO) nanoparticle surface, the organic electronic device according to one embodiment of the present application reduces the trap site, and is effective in enhancing performance of the organic electronic device.

In addition, an amine group is known to have intermolecular attraction with fullerene-based materials normally used in a photoactive layer, and therefore, may perform a role of helping with vertical separation of electron donor materials and electron acceptor materials advantageous for organic electronic device operations.

By the vertical separation of electron donor materials and electron acceptor materials, a path through which electrons and holes migrate more smoothly to respective electrodes is created, and performance of the organic electronic device may be enhanced.

In a bulk heterojunction state having the electron donor materials and the electron acceptor materials randomly mixed, density near an electron transfer layer of the electron acceptor material increases due to a fullerene-amine interaction, and electrons produced at an interface between the electron donor material and the electron acceptor material may readily migrate to the electron transfer layer through the electron acceptor material. Accordingly, the electron donor material has higher density on the upper side of a photoactive layer, and electrons produced at the electron donor material interface may readily migrate to the electron transfer layer through the electron acceptor material.

In one embodiment of the present application, a content of the zinc oxide (ZnO) nanoparticle having one or more amine groups bonding to the surface for the electron transfer layer may be greater than or equal to 0.5 wt % and less than or equal to 10 wt %, and preferably greater than or equal to 0.7 wt % and less than or equal to 8 wt %.

The content of the zinc oxide (ZnO) nanoparticle having one or more amine groups bonding to the surface for the electron transfer layer means a content of the zinc oxide (ZnO) nanoparticle having one or more amine groups bonding to the surface for an electron transfer layer-forming solution when preparing the electron transfer layer.

The electron transfer layer-forming solution may comprise the zinc oxide (ZnO) nanoparticle having one or more amine groups bonding to the surface and an organic solvent.

The organic solvent may be 1-butanol, isopropyl alcohol or methanol, but is not limited thereto as long as it is an organic solvent.

In the present specification, the organic solvent may be an alcohol-based solvent. Examples of the alcohol-based solvent may comprise one or more types selected from the group consisting of ethanol, methanol, 1-butanol and isopropyl alcohol.

When the content of the zinc oxide (ZnO) nanoparticle having one or more amine groups bonding to the surface for the electron transfer layer is 0.5 wt % or greater, a film for forming the electron transfer layer is readily formed, and when the content of the zinc oxide (ZnO) nanoparticle having one or more amine groups bonding to the surface for the electron transfer layer is 10 wt % or less, aggregation of the particles without being dispersed may be prevented.

In one embodiment of the present application, the amine group may be primary amine, secondary amine or tertiary amine.

In one embodiment of the present application, the amine group may be primary amine.

Secondary amine or tertiary amine is bulkier than primary amine causing a problem of decreasing conductivity between the nanoparticles, and due to such bulkiness, an interaction with a fullerene group of the photoactive layer electron acceptor material may also be weakened.

In one embodiment of the present application, the zinc oxide (ZnO) nanoparticle has a diameter of greater than or equal to 1 nm and less than or equal to 100 nm, and preferably greater than or equal to 10 nm and less than or equal to 50 nm. When the zinc oxide nanoparticle size satisfies the above-mentioned range, electron transfer layer thin film uniformity and high packing density may be secured when coating while securing stability of the nanoparticle dispersed solution.

The zinc oxide (ZnO) nanoparticle having a diameter of 1 nm or greater may prevent the nanoparticle state from becoming unstable caused by nanoparticle surface energy becoming too high, thereby may prevent aggregation of nanoparticles in a solution without being well dispersed, and has excellent conductivity due to proper bandgap energy. In addition, the zinc oxide (ZnO) nanoparticle having a diameter of 100 nm or less facilitates packing when coating, and facilitates thin film formation since voids are not produced, and therefore, the thin film is not uneven resulting in a uniform film thickness, and therefore, a device lifetime may increase.

The diameter of the zinc oxide (ZnO) nanoparticle may be measured using a dynamic light scattering (DLS) method by dispersing the zinc oxide (ZnO) nanoparticle into a solution, and by coating the solution on a substrate, the diameter may also be measured with a SEM (or TEM) image.

Figure 4:
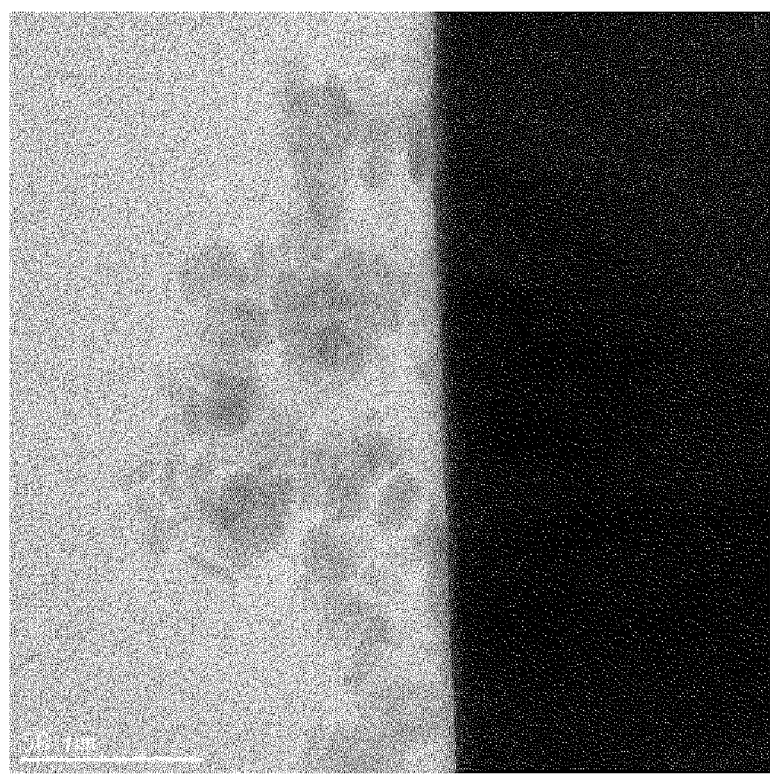
FIG. 4 is a diagram showing a SEM image of the zinc oxide (ZnO) nanoparticles in a coated state.
Figure 5:
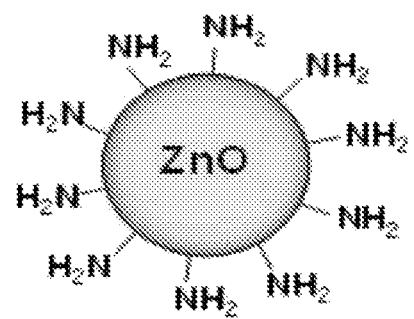
FIG. 5 is a diagram illustrating a zinc oxide (ZnO) nanoparticle having amine groups bonding to a surface thereof according to one embodiment of the present application.

FIG. 4 is a diagram showing a SEM image of the zinc oxide (ZnO) nanoparticle in a coated state. Specifically, the shape of the zinc oxide (ZnO) nanoparticle in a coated state may be identified, and voids between the nanoparticles may also be identified.

In one embodiment of the present application, the photoactive layer comprises an electron donor material and an electron acceptor material.

In another embodiment, the photoactive layer comprises a first electron donor material, a second electron donor material and an electron acceptor material.

In the photoactive layer, the electron donor material forms excitons in which electrons and holes are paired, and the excitons are separated into electrons and holes at an interface between the electron donor/electron acceptor. The separated electrons and holes migrate to the electron donor material and the electron acceptor material, respectively, and by these being collected in a first electrode and a second electrode, respectively, an external use as electric energy becomes possible.

In addition, the photoactive layer may have a bulk heterojunction structure or a bi-layer junction structure in the present application. The bulk heterojunction structure may be a bulk heterojunction (BHJ) type, and the bi-layer junction structure may be a bi-layer junction type.

In one embodiment of the present application, the electron donor material may comprise at least one type of electron donor; or a polymer of at least one type of electron acceptor and at least one type of electron donor. The electron donor material may comprise at least one type of electron donor. In addition, the electron donor material comprises a polymer of at least one type of electron acceptor and at least one type of electron donor.

Specifically, the electron donor material may be, starting from poly[2-methoxy-5-(2'-ethyl-hexyloxy)-1,4-phenylene vinylene] (MEH-PPV), various polymer materials and monomer materials such as thiophene-based, fluorene-based or carbazole-based.

Specifically, the monomer material may comprise one or more types of materials selected from the group consisting of copper(II) phthalocyanine, zinc phthalocyanine, tris[4-(5-dicyanomethylidenemethyl-2-thienyl)phenyl]amine, 2,4-bis[4-(N,N-dibenzylamino)-2,6-dihydroxyphenyl]squaraine, benz[b]anthracene, and pentacene.

Specifically, the polymer material may comprise one or more types of materials selected from the group consisting of poly 3-hexyl thiophene (P3HT), poly[N-9'-heptadecanyl-2,7-carbazole-alt-5,5-(4'-7'-di-2-thienyl-2',1 ',3'-benzothiadiazole)] (PCDTBT), poly[2,6-(4,4-bis-(2,ethylhexyl)-4H-cyclopenta[2,1-b;3,4-b']dithiophene)-alt-4,7-(2,1,3-benzothiadiazole)] (PCPDTBT), poly[2,7-(9,9-dioctyl-fluorene)-alt-5,5-(4,7-di-2-thienyl-2,1,3-benzothiadiazole)] (PFO-DBT), poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7) and poly[2,7-(9,9-dioctyl-dibenzosilole)-alt-4,7-bis(thiophene-2-yl)benzo-2,1,3-thiadiazole] (PSiF-DBT).

In one embodiment of the present application, P3HT, PTB7, PCE-10, small organic molecules, co-block polymers or the like may be used as the electron donor material, however, the electron donor material is not limited thereto.

In one embodiment of the present application, the electron acceptor material may comprise fullerene derivatives or non-fullerene derivatives.

In the present application, the fullerene derivative may be a $C_{60}$ to $C_{90}$ fullerene derivative. Specifically, the fullerene derivative may be a $C_{60}$ fullerene derivative or a $C_{70}$ fullerene derivative.

In the present application, the $C_{60}$ fullerene derivative or the $C_{70}$ fullerene derivative may be each independently selected from the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group comprising one or more of N, O and S atoms, or adjacent two substituents may be further substituted with a substituent forming a fused ring.

In the present application, the fullerene derivative may be selected form the group consisting of $C_{76}$ fullerene derivatives, $C_{78}$ fullerene derivatives, $C_{84}$ fullerene derivatives and $C_{90}$ fullerene derivatives.

In the present specification, the $C_{76}$ fullerene derivative, the $C_{78}$ fullerene derivative, the $C_{84}$ fullerene derivative and the $C_{90}$ fullerene derivative may be each independently selected form the group consisting of hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; and a substituted or unsubstituted heterocyclic group comprising one or more of N, O and S atoms, or adjacent two substituents may be further substituted with a substituent forming a fused ring.

The fullerene derivative is advantageous in efficiency properties due to, compared to a non-fullerene derivative, having excellent electron-hole pair (exciton) separating ability and charge mobility.

In the present application, the electron donor material and the electron acceptor material may form a bulk heterojunction (BHJ) in the photoactive layer.

The photoactive materials as above may be introduced to the photoactive layer using a method of dissolving the materials in an organic solvent and then spin coating the solution, and the like. Herein, the photoactive layer may use methods such as dip coating, screen printing, spray coating, doctor blade or brushing painting.

In one embodiment of the present application, $PC_{61}BM$, $PC_{71}BM$, ICBA or the like may be used as the electron acceptor material, however, the electron acceptor material is not limited thereto.

In one embodiment of the present application, the electron transfer layer further comprises one, two or more selected from the group consisting of conductive oxides and metals.

In one embodiment of the present application, the electron transfer layer further comprises one, two or more selected from the group consisting of titanium oxide; zinc oxide; and cesium carbonate.

In one embodiment of the present application, the electron transfer layer has a thickness of greater than or equal to 10 nm and less than or equal to 100 nm, and preferably greater than or equal to 15 nm and less than or equal to 90 nm in the organic electronic device.

When the electron transfer layer has a thickness of 10 nm or higher, a film is readily formed by a proper thickness of the electron transfer layer for the nanoparticle size, and accordingly, a role of an electron transfer layer may be performed. In addition, the electron transfer layer having a thickness of 100 nm or less may prevent electrons separated from the photoactive layer from unsmoothly migrating to the electrode due to decreased resistance of the electron transfer layer.

In the present application, the organic electronic device further comprises a substrate, the first electrode is provided on the substrate, and the first electrode may be an anode. Specifically, the organic electronic device may be an organic electronic device having a normal structure.

FIG. 1 illustrates one example of an organic electronic device according to one embodiment of the present application. Specifically, FIG. 1 illustrates an organic electronic device having an inverted structure. More specifically, FIG. 1 illustrates an organic electronic device having an inverted structure in which a substrate (101), a first electrode (102), an electron transfer layer (103), a photoactive layer (104), a hole transfer layer (105) and a second electrode (106) are consecutively laminated.

In the present application, substrates having excellent transparency, surface smoothness, handling easiness and water resistance may be used as the substrate. Specifically, a glass substrate, a thin film glass substrate or a transparent plastic substrate may be used. As the plastic substrate, films such as polyethylene terephthalate (PET), polyethylene naphthalate (PEN), polyether ether ketone (PEEK) and polyimide (PI) may be included in a monolayer or multilayer form. However, the substrate is not limited thereto, and substrates commonly used in an organic electronic device may be used.

As the substrate according to one embodiment of the present application, glass, PET, PI or the like may be used, however, the substrate is not limited thereto.

In the present application, the first electrode may be an anode, and the second electrode may be a cathode. In addition, the first electrode may be a cathode, and the second electrode may be an anode.

In one embodiment of the present application, indium tin oxide (ITO), Ag nanowires, PEDOT:PSS, metal meshes, carbon nanotubes, conductive polymers, fluorine doped tin dioxide (FTO) or the like may be used as the first electrode and the second electrode, however, the first electrode and the second electrode are not limited thereto.

In the present application, the first electrode may be a transparent electrode.

When the first electrode is a transparent electrode, the first electrode may be a conductive oxide such as indium tin oxide (ITO) or indium zinc oxide (IZO). Furthermore, the first electrode may be a translucent electrode. When the first electrode is a translucent electrode, it may be prepared with a translucent metal such as Ag, Au, Mg, Ca or alloys thereof. When using a translucent metal as the first electrode, the organic solar cell may have a microcavity structure.

When the first electrode of the present specification is a transparent conductive oxide layer, the electrode may comprise, in addition to glass and a quartz plate, those coating a material having conductivity on a flexible and transparent material such as plastic comprising polyethylene terephthalate (PET), polyethylene naphthalate (PEN), polypropylene (PP), polyimide (PI), polycarbonate (PC), polystyrene (PS), polyoxymethylene (POM), an acrylonitrile styrene (AS) resin (copolymer), an acrylonitrile butadiene styrene (ABS) resin (copolymer), triacetyl cellulose (TAC), polyarylate (PAR) or the like. Specifically, indium tin oxide (ITO), fluorine-doped tin oxide (FTO), aluminum-doped zinc oxide (AZO), indium zinc oxide (IZO), $ZnO—Ga_2O_3$, $ZnO—Al_2O_3$, antimony tin oxide (ATO) or the like may be included, and more specifically, ITO may be included.

In the present application, the second electrode may be a metal electrode. Specifically, the metal electrode may comprise one, two or more types selected from the group consisting of silver (Ag), aluminum (Al), platinum (Pt), tungsten (W), copper (Cu), molybdenum (Mo), gold (Au), nickel (Ni) and palladium (Pd).

In the present application, the organic electronic device may have an inverted structure. When the organic electronic device according to one embodiment of the present application has an inverted structure, the second electrode may be a metal electrode. Specifically, when the organic electronic device according to one embodiment of the present specification has an inverted structure, the second electrode may be gold (Au), silver (Ag), aluminum (Al), $MoO_3/Au$, $MoO_3/Ag$, $MoO_3/Al$, $V_2O_5/Au$, $V_2O_5/Ag$, or $V_2O_5/Al$, but is not limited thereto.

The organic electronic device having an inverted structure of the present application may mean an anode and a cathode of an organic electronic device having a general structure being formed in a reverse direction.

Figure 2:
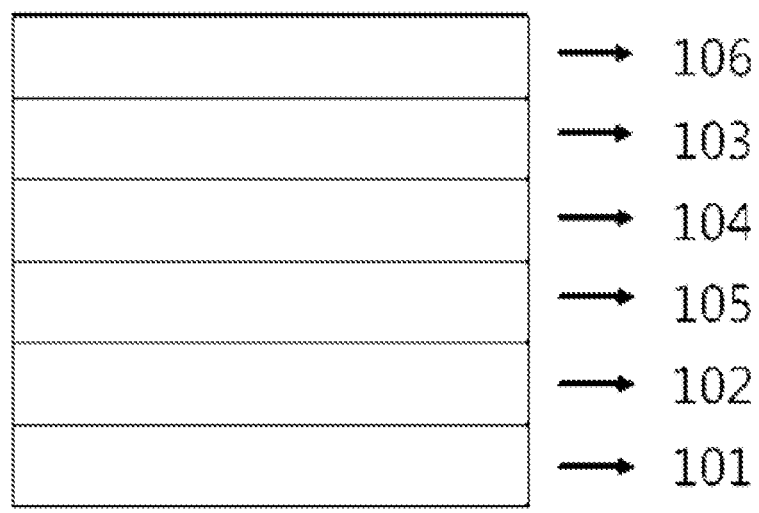
Figure 3:
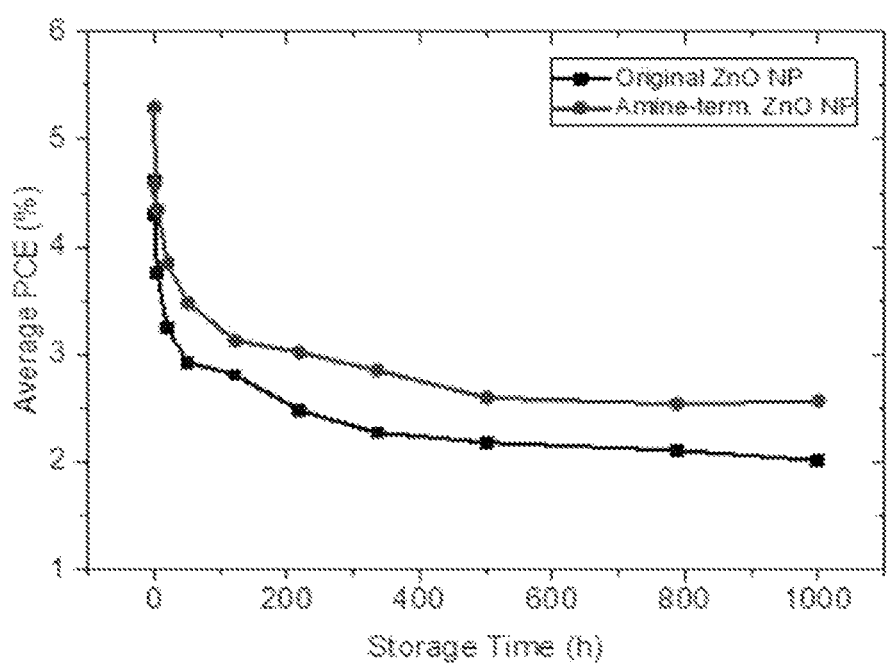
FIG. 3 is a graph showing changes in average device efficiency of an organic electronic device manufactured in embodiments of the present application depending on solar irradiation.

FIG. 2 illustrates one example of an organic electronic device according to one embodiment of the present application. Specifically, FIG. 2 illustrates an organic electronic device having a conventional structure. More specifically, FIG. 2 illustrates an organic electronic device having a conventional structure in which a substrate (101), a first electrode (102), a hole transfer layer (105), a photoactive layer (104), an electron transfer layer (103) and a second electrode (106) are consecutively laminated.

In the present application, the organic electronic device may further comprise an organic material layer. The organic material layer may further comprise one or more layers selected from the group consisting of a hole injection layer, a hole transfer layer, an electron blocking layer, an electron transfer layer and an electron injection layer.

In one embodiment of the present application, the hole transfer layer material may comprise a material increasing probability of generated charges migrating to the electrode by efficiently transferring holes to the photoactive layer, but is not particularly limited thereto.

Specifically, tertiary butyl pyridine (TBP), lithium bis (trifluoromethanesulfonyl)imide (LiTFSI), poly(3,4-ethylenedioxythiophene):poly(4-styrenesulfonate) [PEDOT:

PSS] or the like may be used as the hole transfer layer, however, the hole transfer layer is not limited thereto.

On the top of the photoactive layer, the hole transfer layer may be introduced through a method such as spin coating, dip coating, inkjet printing, gravure printing, spray coating, doctor blade, bar coating, gravure coating, brush painting or thermal deposition. In this case, poly(3,4-ethylenedioxythiophene):poly(4-styrenesulfonate) [PEDOT:PSS] is normally used as a conductive polymer solution, and as a hole-extracting metal oxide material, molybdenum oxide ($MoO_x$), vanadium oxide ($V_2O_5$), nickel oxide (NiO), tungsten oxide ($WO_x$) or the like may be used.

Specifically, PEDOT:PSS, $VO_x$, $MoO_x$, NiO, $WO_3$ or the like may be used as the hole transfer layer, however, the hole transfer layer is not limited thereto.

The range of x is from 1 to 7, and preferably an integer of 1 to 5.

In the present specification, the organic electronic device may have a wound structure. Specifically, the organic electronic device may be manufactured into a flexible film form, and by rolling this into a cylinder shape, an electronic device having a hollow wound structure may be manufactured. When the organic electronic device has a wound structure, it may be installed in a standing position on the ground. In this way, a portion where the incident angle of the light becomes maximum may be secured while the sun at a place where the organic electronic device is installed moves from east to west. Accordingly, there is an advantage of increasing efficiency by absorbing as much light as possible while the sun is out.

One embodiment of the present application provides a method for manufacturing an organic electronic device comprising preparing a substrate; forming a first electrode on the substrate; forming an electron transfer layer on the first electrode; forming a photoactive layer on the electron transfer layer; and forming a second electrode on the photoactive layer, wherein the electron transfer layer comprises a zinc oxide (ZnO) nanoparticle having one or more amine groups bonding to the surface.

Another embodiment of the present application provides a method for manufacturing an organic electronic device comprising preparing a substrate; forming a second electrode on the substrate; forming a photoactive layer on the second electrode; forming an electron transfer layer on the photoactive layer; and forming a first electrode on the electron transfer layer, wherein the electron transfer layer comprises a zinc oxide (ZnO) nanoparticle having one or more amine groups bonding to the surface.

In one embodiment of the present application, forming a hole transfer layer may be further included between the forming of a photoactive layer and the forming of a second electrode.

In one embodiment of the present application, forming of the zinc oxide (ZnO) nanoparticle having one or more amine groups bonding to the surface is forming by preparing the zinc oxide (ZnO) nanoparticle and then attaching an amine group to the surface, or forming by introducing an amine group raw material while synthesizing the zinc oxide (ZnO) nanoparticle in the method for manufacturing an organic electronic device.

Synthesizing of the zinc oxide (ZnO) nanoparticle follows gas synthesis, solid synthesis or solution synthesis in the method for manufacturing an organic electronic device.

A method of evaporation or plasma deposition may be used as the gas synthesis method, however, the gas synthesis method is not limited thereto.

A method of grinding or pyrolysis may be used as the solid synthesis method, however, the solid synthesis method is not limited thereto.

A hydrothermal method, a sol-gel method, a precipitation method, a hot-injection method, an organometallic approach, microwave synthesis or the like may be used as the solution synthesis method, however, the solution synthesis method is not limited thereto.

In one embodiment of the present application, the method of forming an electron transfer layer is spin coating, bar coater coating, slot die, spray coating or gravure printing in the method for manufacturing an organic electronic device.

In one embodiment of the present application, the method of forming an electron transfer layer is bar coater coating in the method for manufacturing an organic electronic device.

Hereinafter, the present specification will be described in detail with reference to examples in order to specifically describe the present specification. However, examples according to the present specification may be modified to various different forms, and the scope of the present specification is not construed as being limited to the examples described below. Examples of the present specification are provided in order to more fully describe the present specification to those having average knowledge in the art.

Example 1

A zinc oxide (ZnO) nanoparticle having one or more amine groups bonding to the surface was prepared by bonding a zinc oxide (ZnO) nanoparticle having a diameter of 10 nm to 30 nm to an amine group, and was dispersed into a 1-butanol solvent in a 2.5 wt % content to prepare an electron transfer layer solution.

With the prepared electron transfer layer solution, a zinc oxide (ZnO) nanoparticle thin film having one or more amine groups bonding to the surface was formed on a glass/ITO substrate using a bar coater. After that, a zinc oxide (ZnO) nanoparticle electron transfer layer having one or more amine groups bonding to the surface was prepared by drying the result for 10 minutes in a 100° C. oven.

After that, P3HT as an electron donor material and $PC_{61}BM$ as an electron acceptor material were dissolved in an organic solvent, and the result was bar coated on the electron transfer layer to form a photoactive layer in a bulk heterojunction state.

After completely evaporating the organic solvent of the photoactive layer, a $MoO_3$/Ag second electrode was formed using a thermal deposition method, and an organic electronic device having an inverted structure with a photoactive area of 1.00 $cm^2$ was completed.

Example 2

An organic electronic device was manufactured in the same manner as in Example 1 except that, in the manufacturing method of Example 1, a large area organic electronic device was manufactured, and several large area organic electronic devices were series connected to manufacture an organic electronic device module with a photoactive area of 6.40 $cm^2$.

Example 3

An organic electronic device was manufactured in the same manner as in Example 2 except that, in the manufacturing method of Example 2, PTB7 was used instead of P3HT as the electron donor material.

Comparative Example 1

An organic electronic device was manufactured in the same manner as in Example 1 except that an electron transfer layer was prepared with an electron transfer layer solution in which a zinc oxide (ZnO) nanoparticle was dispersed into a 1-butanol solvent.

Comparative Example 2

An organic electronic device was manufactured in the same manner as in Example 2 except that an electron transfer layer was prepared with an electron transfer layer solution in which a zinc oxide (ZnO) nanoparticle was dispersed into a 1-butanol solvent.

Comparative Example 3

An organic electronic device was manufactured in the same manner as in Example 3 except that an electron transfer layer was prepared with an electron transfer layer solution in which a zinc oxide (ZnO) nanoparticle was dispersed into a 1-butanol solvent.

TABLE 1

|  | Voc (V) | Jsc (mA/cm$^2$) | FF (%) | H (%) | $\eta$avg (%) |
| --- | --- | --- | --- | --- | --- |
| Example 1 | 0.974 | 11.065 | 0.510 | 5.50 | 5.35 ± 0.12 |
| Example 2 | 4.863 | 2.029 | 0.495 | 4.88 | — |
| Example 3 | 3.816 | 3.269 | 0.556 | 6.94 | — |
| Comparative Example 1 | 0.966 | 11.024 | 0.471 | 5.02 | 4.87 ± 0.09 |
| Comparative Example 2 | 4.400 | 2.082 | 0.452 | 4.14 | — |
| Comparative Example 3 | 3.734 | 3.337 | 0.516 | 6.43 | — |

In Table 1, the Voc means an open-circuit voltage, the Jsc means a short-circuit current, the FF means a fill factor, the $\eta$ means energy conversion efficiency, and the $\eta$avg means average energy conversion efficiency of 10 organic electronic devices. The open voltage and the short-circuit current are x-axis and y-axis intercepts, respectively, in the four quadrants of a voltage-current density curve, and as these two values increase, organic electronic device efficiency preferably increases. In addition, the fill factor is a value dividing the rectangle area that may be drawn inside the curve by the product of the short-circuit current and the open-circuit voltage. The energy conversion efficiency may be obtained when these three values are divided by the intensity of irradiated light, and it is preferred as the value increases.

As shown in Table 1, it was seen that, when using the zinc oxide (ZnO) nanoparticle thin film having one or more amine groups bonding to the surface as an electron transfer layer of an organic solar cell as in Examples 1 to 3, high energy conversion efficiency and an excellent fill factor were obtained compared to the organic electronic devices using zinc oxide (ZnO) having no amine group bonding to the surface as in Comparative Examples 1 to 3.

When using the zinc oxide (ZnO) nanoparticle thin film having one or more amine groups bonding to the surface as an electron transfer layer of an organic electronic device as described above, it was seen that an open-circuit voltage and a fill factor appeared to be high by an interaction between an end group of the amine group and an electron acceptor material of the photoactive layer, and particularly, the amine end group caused surface defect passivation of the ZnO nanoparticle enhancing a lifetime for light-soaking.

What is claimed is:

1. An organic electronic device comprising:
    a first electrode;
    a second electrode on the first electrode;
    a photoactive layer between the first electrode and the second electrode; and
    an electron transfer layer between the photoactive layer and the first electrode,
    wherein the electron transfer layer comprises a zinc oxide (ZnO) nanoparticle comprising one or more amine groups bonding to a surface of the zinc oxide (ZnO) nanoparticle,
    wherein the one or more amine groups are primary amines,
    wherein the photoactive layer comprises an electron donor material and an electron acceptor material,
    wherein the electron acceptor material is a fullerene derivative,
    wherein the zinc oxide (ZnO) nanoparticle comprises 0.5 wt % to 10 wt % of the electron transfer layer, and
    wherein the electron transfer layer further comprises one, two or more selected from the group consisting of conductive oxides and metals.

2. The organic electronic device of claim 1, further comprising a hole transfer layer between the photoactive layer and the second electrode.

3. The organic electronic device of claim 1, wherein the zinc oxide (ZnO) nanoparticle has a diameter of 10 nm to 50 nm.

4. The organic electronic device of claim 1, wherein the electron transfer layer further comprises one, two or more selected from the group consisting of titanium oxide, zinc oxide, and cesium carbonate.

5. The organic electronic device of claim 1, wherein the electron transfer layer has a thickness of 10 nm to 100 nm.

6. The organic electronic device of claim 1, wherein the organic electronic device further comprises one, two or more organic material layers selected from the group consisting of a hole injection layer, a hole transfer layer, a hole blocking layer, a charge generation layer, an electron blocking layer, an electron injection layer, and an additional electron transfer layer.

7. A method for manufacturing an organic electronic device, the method comprising:
    providing a substrate;
    forming a first electrode on the substrate;
    forming an electron transfer layer on the first electrode;
    forming a photoactive layer on the electron transfer layer; and
    forming a second electrode, on the photoactive layer,
    wherein the electron transfer layer comprises a zinc oxide (ZnO) nanoparticle comprising one or more amine groups bonding to a surface of the zinc oxide (ZnO) nanoparticle,
    wherein the one or more amine groups are primary amines,
    wherein the photoactive layer comprises an electron donor material and an electron acceptor material,
    wherein the electron acceptor material is a fullerene derivative,
    wherein the zinc oxide (ZnO) nanoparticle comprises 0.5 wt % to 10 wt % of the electron transfer layer, and wherein the electron transfer layer further comprises one, two or more selected from the group consisting of conductive oxides and metals.

8. A method for manufacturing an organic electronic device, the method comprising:
providing a substrate;
forming a second electrode on the substrate;
forming a photoactive layer on the second electrode;
forming an electron transfer layer on the photoactive layer; and
forming a first electrode on the electron transfer layer,
wherein the electron transfer layer comprises a zinc oxide (ZnO) nanoparticle comprising one or more amine groups bonding to a surface of the zinc oxide (ZnO) nanoparticle,
wherein the one or more amine groups are primary amines,
wherein the photoactive layer comprises an electron donor material and an electron acceptor material,
wherein the electron acceptor material is a fullerene derivative,
wherein the zinc oxide (ZnO) nanoparticle comprises 0.5 wt % to 10 wt % of the electron transfer layer, and
wherein the electron transfer layer further comprises one, two or more selected from the group consisting of conductive oxides and metals.

9. The method of claim 7 further comprising forming a hole transfer layer after forming of the photoactive layer and before forming of the second electrode.

10. The method of claim 7, wherein the zinc oxide (ZnO) nanoparticle is formed by attaching the one or more amine groups to the surface of the zinc oxide (ZnO) nanoparticle, or by introducing an amine group raw material while synthesizing the zinc oxide (ZnO) nanoparticle.

11. The method of claim 10, wherein synthesizing of the zinc oxide (ZnO) nanoparticle is performed by gas synthesis, solid synthesis or solution synthesis.

12. The method of claim 7, wherein forming of the electron transfer layer comprises coating with a solution that comprises an organic solvent and the zinc oxide (ZnO) nanoparticle.

13. The method of claim 12, wherein the coating is performed using a bar coater.

14. The method of claim 7, wherein forming the electron transfer layer and the photoactive layer comprises sequentially forming the electron transfer layer and the photoactive layer on the first electrode.

15. The organic electronic device of claim 1, wherein the organic electronic device is an organic solar cell.

16. The organic electronic device of claim 1, wherein the one or more amine groups are bonded to the surface of the zinc oxide (ZnO) nanoparticle by covalent bonding, chemisorption or physisorption.

* * * * *